United States Patent [19]

Khanna

[11] Patent Number: 4,649,354
[45] Date of Patent: Mar. 10, 1987

[54] SWITCHABLE MULTI-FREQUENCY DIELECTRIC RESONATOR OSCILLATOR

[75] Inventor: Amarpal S. Khanna, Sunnyvale, Calif.

[73] Assignee: Avantek, Inc., Santa Clara, Calif.

[21] Appl. No.: 809,161

[22] Filed: Dec. 16, 1985

[51] Int. Cl.[4] .............................................. H03B 5/18
[52] U.S. Cl. ................................... 331/99; 331/117 D; 331/117 FE; 331/179
[58] Field of Search .............. 331/96, 117 R, 117 FE, 331/117 D, 179, 99; 334/42, 43, 47

[56] References Cited

U.S. PATENT DOCUMENTS

| | | | |
|---|---|---|---|
| 3,969,681 | 7/1976 | Fincke | 331/179 X |
| 4,078,210 | 3/1978 | Lewis | 331/179 X |
| 4,442,415 | 4/1984 | Ashida | 331/179 X |
| 4,484,156 | 11/1984 | Khanna et al. | 331/96 X |

Primary Examiner—Siegfried H. Grimm
Attorney, Agent, or Firm—Limbach, Limbach & Sutton

[57] ABSTRACT

A switchable multi-frequency dielectric resonator oscillator that generates microwave energy at any of several available frequencies is disclosed. The oscillator includes a transistor that is operable for oscillation at a frequency determined by a feedback resonator connected to its control terminal, and switching means for selectively connecting any one of a plurality of feedback resonators to the control terminal of the transistor. The oscillation frequency of the oscillator is determined by the resonant frequency of whichever of the feedback resonators is connected to the control terminal of the transistor through the switching means. It is preferred to utilize dielectric resonators as the feedback resonators, a field effect transistor as the transistor, and PIN diodes as the switching means.

20 Claims, 8 Drawing Figures

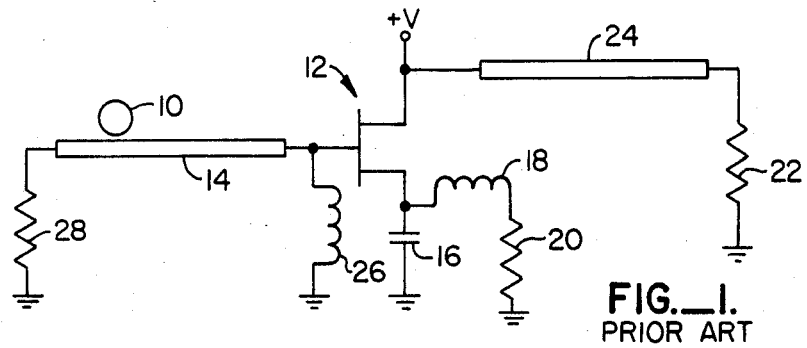
FIG._1.
PRIOR ART
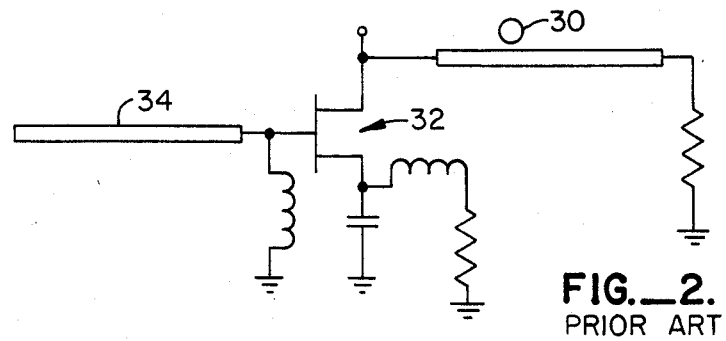
FIG._2.
PRIOR ART
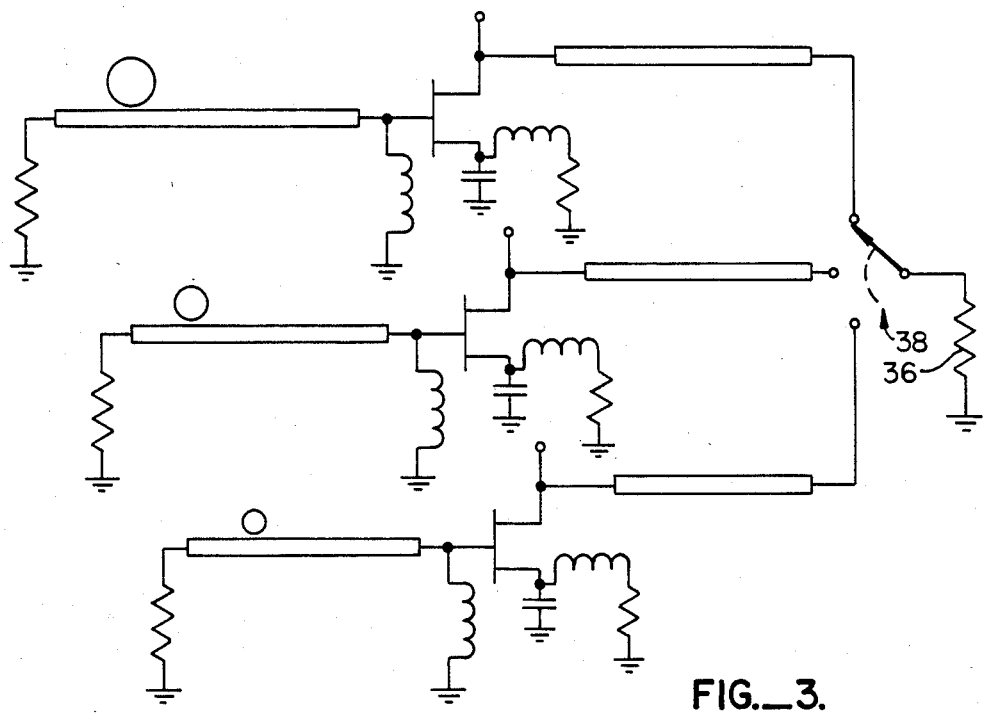
FIG._3.
PRIOR ART

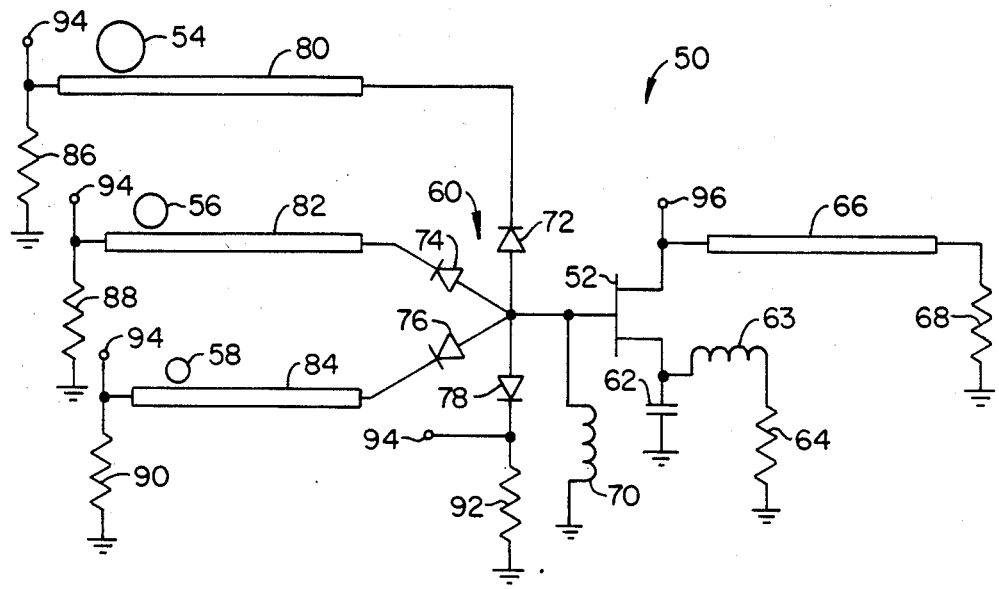
FIG._4.
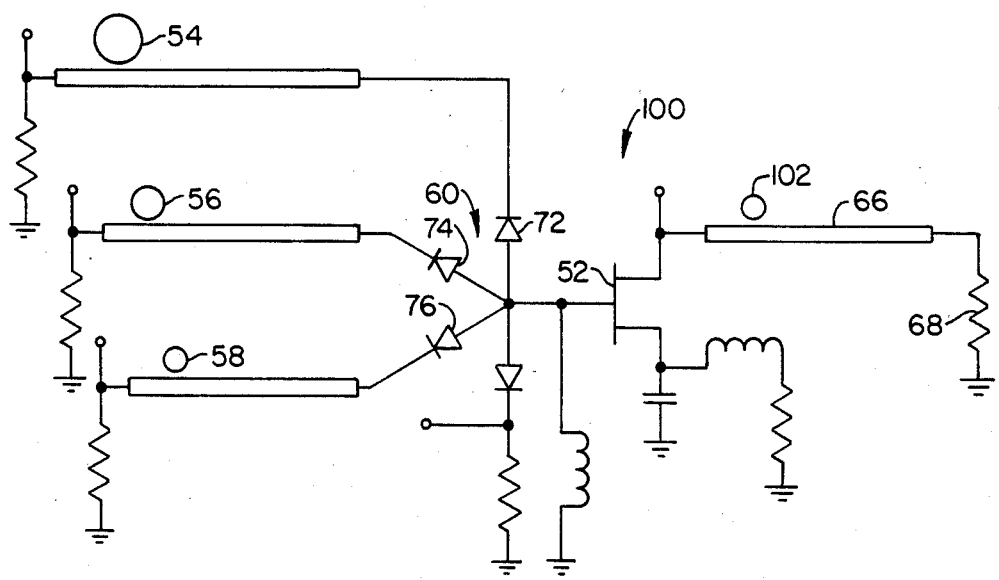
FIG._5.

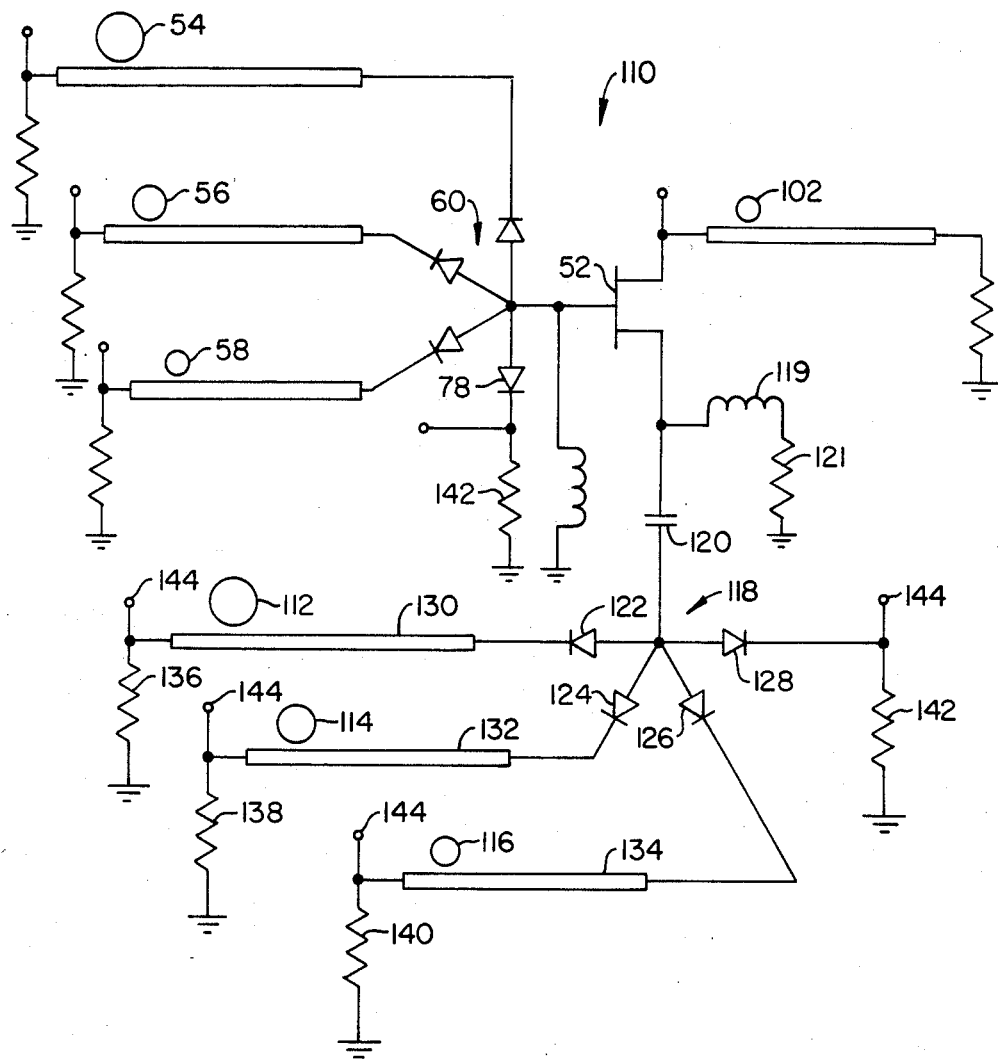
FIG._6.

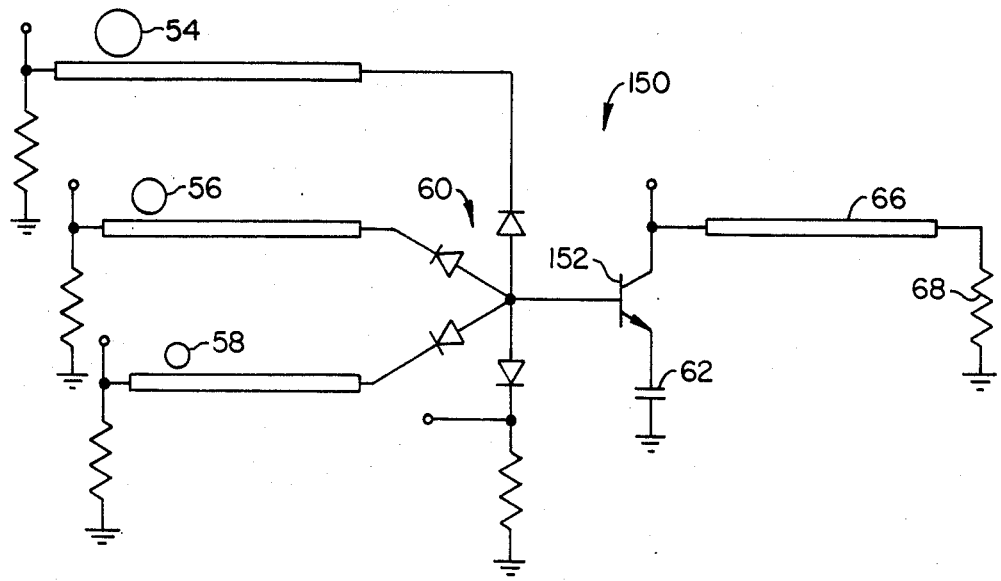
FIG._7.
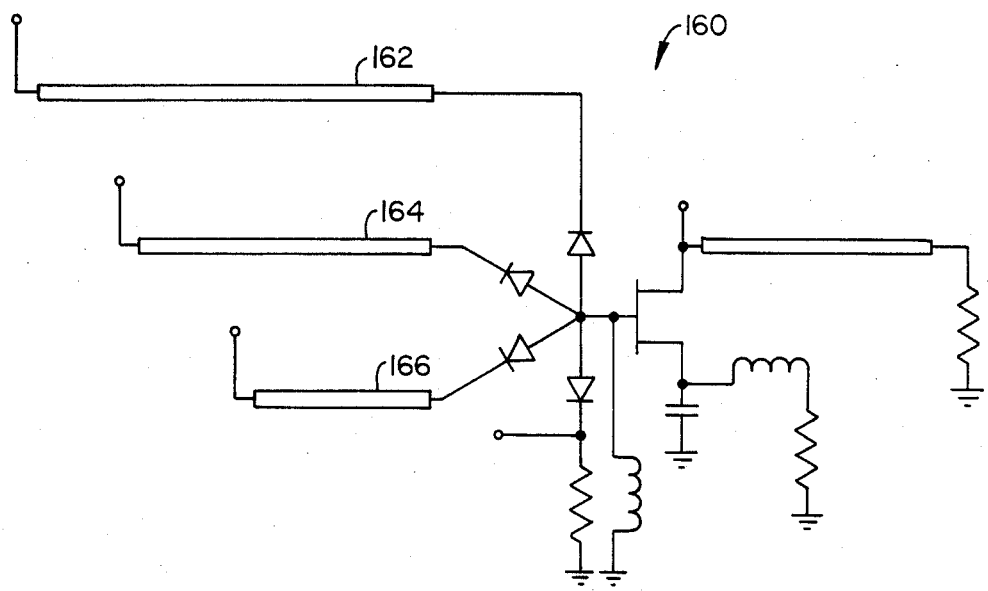
FIG._8.

SWITCHABLE MULTI-FREQUENCY DIELECTRIC RESONATOR OSCILLATOR

BACKGROUND OF THE INVENTION

1. Field of the Invention

This invention relates generally to dielectric resonator oscillators for generating microwave energy, and relates more particularly to a dielectric resonator oscillator that generates microwave energy at any of several fixed frequencies.

2. Description of the Relevant Art

Microwave frequency oscillators are key elements of many communication systems and radars. Fixed frequency microwave oscillators are often implemented in hybrid circuits using transistors (either field effect or bipolar) and dielectric resonators passively coupled to microstrip lines. Two such dielectric resonator oscillators, known in the prior art, are shown in FIGS. 1 and 2.

The oscillator of FIG. 1 includes a dielectric resonator 10 as a series feedback element coupled to the gate terminal of a field effect transistor 12 via a microstrip line 14. The source terminal of the transistor is coupled to ground via a capacitor 16 and via an inductor 18 and resistor 20 wired in series to ground and in parallel to capacitor 16. The drain terminal of the transistor is coupled to the load 22 via a microstrip line 24.

The gate terminal of the transistor 12 and one end of the microstrip line 14 are grounded via inductor 26, while the other end of the microstrip line 14 is grounded via resistor 28. In operation, a positive direct current voltage is applied to the drain terminal of the transistor, and the resistor 20 determines the biasing condition (i.e., drain current) of the transistor. The transistor 12 oscillates at a frequency equal to the resonant frequency of the dielectric resonator 10.

The oscillator of FIG. 2 includes a dielectric resonator 30 as a stabilization element coupled to the drain terminal of a field effect transistor 32. The transistor 32 of FIG. 2 is biased in the same way as the transistor 12 of FIG. 1. A stub length 34 of microstrip line is connected to the gate terminal of the transistor 32. Without the dielectric resonator 30, the oscillator would be free running, but with the resonator, the oscillator stabilizes at the resonant frequency of the resonator.

While such single frequency oscillators are useful, there is also a need for microwave oscillators that can selectively generate any of several fixed frequencies. The design requirements of such an oscillator include (1) output frequency selection from several available frequencies, (2) stable output frequencies, (3) fast switching between frequencies, and (4) no spurious signals.

One prior art approach is to join together several dielectric resonator oscillators, as shown in FIG. 3. Three separate dielectric resonator oscillators, each with a different operational frequency, are selectively connected to a load 36 via a switch 38, which is shown schematically as a single-pole, triple-throw switch. The switch 38 may be implemented using PIN type diodes. Often an additional transistor is used between each dielectric resonator oscillator and the switch 38 for output signal amplification and to isolate the oscillator from the load.

In some implementations of such a multiple frequency device, all of the dielectric resonator oscillators continuously operate in order to provide stable operation and to allow fast switching from one frequency to another. In theory, only the signal generated by the selected dielectric resonator oscillator is supplied to the output terminal. In actuality, however, signals from the non-selected dielectric resonator oscillators leak through the switch to create unwanted spurious signals in the output signal. Extremely high isolation switches are required to reduce the leakage through the switch. The isolation values required are generally difficult to meet as a practical matter even with complex and expensive multi-throw switches, particularly within the X and Ku bands. The presence of spurious signals can be a very severe problem in certain electronic warfare systems, wherein a spurious signal may be erroneously interpreted as a threat signal.

In other implementations of the prior art multiple frequency device, the dielectric resonator oscillators are switched on only when needed to generate the output signal. While this approach eliminates the spurious signal problem, it greatly increases the switching time because one oscillator must be switched on and another oscillator must be switched off each time the output frequency is changed. In addition, frequency of the output signal may wander somewhat before the selected dielectric resonator oscillator stabilizes. Thus, this implementation suffers from the drawbacks of increased switching time and decreased stability.

SUMMARY OF THE INVENTION

In accordance with the illustrated preferred embodiment, the present invention provides a switchable multi-frequency dielectric resonator oscillator that generates microwave energy at any of several available frequencies. In one embodiment, the oscillator includes a transistor that is operable for oscillation at a frequency determined by a feedback resonator connected to its control terminal, and switching means for selectively connecting any one of a plurality of feedback resonators to the control terminal of the transistor. The oscillation frequency of the oscillator is determined by the resonant frequency of whichever of the feedback resonators is connected to the control terminal of the transistor through the switching means. It is preferred to utilize dielectric resonators as the feedback resonators, a field effect transistor as the transistor, and PIN diodes as the switching means.

In another embodiment, the oscillator additionally includes a stabilization resonator coupled to the output terminal of the transistor to provide an additional operational frequency. In this embodiment, when the switching means isolates the feedback resonators from the control terminal of the transistor, the oscillation frequency of the oscillator is determined by the resonant frequency of the stabilization resonator.

In still another embodiment, the oscillator includes a field effect transistor with feedback resonators switchably coupled to both the gate and source terminals. The oscillation frequency of this embodiment of the oscillator is determined by the resonant frequency of whichever of the feedback resonators is connected to the transistor.

The switchable multi-frequency oscillator of the present invention offers several advantages over prior art multiple frequency oscillators. First, there are no spurious frequencies in the output signal because the unused dielectric resonators are passive components and do not themselves oscillate. Only when a dielectric resonator is selectively coupled to the transistor through the switch is a signal generated. Second, fewer transistors are required, which means that the multiple frequency oscillator of the present invention can be constructed in a smaller size and at a lower cost and, while operating, will consume less power. Third, the settling time and switching speed between frequencies is fast because only passive components are switched and because the transistor is always biased.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIG. 1 is a schematic diagram of a prior art series feedback type of a dielectric resonator oscillator.

FIG. 2 is a schematic diagram of a prior art stabilization type of a dielectric resonator oscillator.

FIG. 3 is a schematic diagram of a prior art multiple frequency oscillator utilizing three series feedback dielectric resonator oscillators.

FIG. 4 is a schematic diagram of a switchable multifrequency oscillator according to the present invention.

FIG. 5 is a schematic diagram of an alternative embodiment of the oscillator of the present invention that includes a stabilization resonator.

FIG. 6 is a schematic diagram of an alternative embodiment of the oscillator of the present invention that includes series feedback resonators coupled to both the gate and source of the transistor.

FIG. 7 is a schematic diagram of an alternative embodiment of the oscillator of the present invention that includes a bipolar transistor.

FIG. 8 is a schematic diagram of an alternative embodiment of the oscillator of the present invention that includes microstrip line resonators.

DETAILED DESCRIPTION OF THE PREFERRED EMBODIMENT

FIGS. 1 through 8 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is a dielectric resonator oscillator 50, as shown in FIG. 4, that generates microwave energy at any of several available frequencies. The oscillator 50 includes three basic elements: a field effect transistor 52, three dielectric resonators 54, 56, and 58 connected as series feedback elements, and a diode switch 60 that selectively couples one of the three dielectric resonators to the gate terminal of the transistor. The transistor 52 is operable for oscillation at a frequency determined by the resonant frequency of whichever of the dielectric resonators is connected to the gate terminal of the transistor.

More specifically, the transistor 52 has its source terminal coupled to ground through a capacitor 62 and through an inductor 63 and resistor 64 wired in series to ground and in parallel to the capacitor 62. The transistor 52 has its drain terminal coupled to a load 68 through a microstrip line 66. The gate terminal of the transistor 52 is connected to the common anode terminal of the diode switch 60 and to ground through an inductor 70. The diode switch 60 includes four diodes 72, 74, 76, and 78. The cathodes of diodes 72, 74, and 76 are respectively connected to microstrip lines 80, 82, and 84, which extend past the adjacently positioned dielectric resonators 54, 56, and 58, respectively. The opposite ends of microstrip lines 80, 82, and 84 are terminated to ground through resistors 86, 88, and 90, respectively. The cathode of diode 78 is terminated to ground through resistor 92. Biasing terminals 94 are provided at the cathode side of each diode for the application of bias voltages to operate the diode switch 60.

The oscillator 50 is preferably implemented as a hybrid circuit with connections between the transistor and the dielectric resonator being accomplished with microstrip lines, which are conductive traces on the surface of a non-conductive substrate, such as a ceramic. The dielectric resonators 54, 56, and 58 are preferably cylindrical in shape with one base affixed to the substrate. The sizes of the dielectric resonators are chosen for their effective resonant frequencies, according to design information available in the prior art. The actual positioning of the dielectric resonators with respect to their corresponding microstrip lines determines the degree of coupling between the dielectric resonators and the microstrip lines as is known in prior art descriptions of dielectric resonator oscillators. The component values of the resistors 64, 68, 86, 88, 90, and 92, capacitor 62, and inductors 63 and 70 are specified according to methods known in the prior art so as to allow the transistor 52 to oscillate. The diodes of the diode switch 60 are preferably PIN diodes, which have an intrinsic layer sandwiched between the positive and negative doped layers, and which are known to work well for switching at microwave frequencies. Such PIN diodes may be obtained, for example, from Scientific Devices, Inc. of N. Billerica, Mass.

In operation as an oscillator, one of the diodes 72, 74, or 76 is forward biased and the other three diodes are reversed biased by application of appropriate voltages at the biasing terminals 94. Such biasing electrically connects one of the three microstrip lines 80, 82, or 84 to the gate terminal of the transistor 52, while isolating the other two microstrip lines and resistor 92. For example, if diodes 74, 76, and 78 are reverse biased and diode 72 is forward biased, then the microstrip line 80 and its associated dielectric resonator 54 are thereby coupled to the gate terminal of the transistor 52. In order to power the transistor 52, a direct current voltage is applied to the drain terminal of the transistor through terminal 96. The transistor 52 will now oscillate at a frequency determined by the resonant frequency of the dielectric resonator coupled to the gate terminal of the transistor through the diode switch 60. If, according to the example, the dielectric resonator 54 has a resonant frequency of 10.0 GHz, then the transistor will oscillate at 10.0 GHz. The resultant output signal of the oscillator 50 is provided to other circuitry, i.e., load 68, through the output microstrip line 66.

In order to switch to a different frequency, the diode switch 60 switches in a different microstrip line and associated dielectric resonator for connection to the gate terminal of the transistor 52. To switch out the previously connected microstrip line and dielectric resonator, the connecting diode is simply reverse biased by applying an appropriate voltage at the biasing terminal 94 for that branch. To switch in the desired microstrip line and dielectric resonator, the connecting diode is forward biased by applying an appropriate voltage at the biasing terminal 94 for that branch. Since a different dielectric resonator in now passively coupled to the oscillator circuit, the oscillator changes its oscillation frequency to match that of the newly coupled dielectric resonator.

Thus, the dielectric resonator oscillator 50 has three available frequencies from which its operational frequency can be selected. Since only one dielectric resonator is coupled to the oscillator circuit at any one time, no spurious signals are generated. Also, since the transistor is constantly biased, the switching speed and settling time of the oscillator 50 is excellent. If for some reason it is desirable to stop the oscillation of the transistor 52, then the resistor 92 is switched into connection to the gate terminal of the transistor by forward biasing diode 78 and reverse biasing the other diodes 72, 74, and 76. This decouples the transistor from the dielectric resonators 54, 56, and 58, and stops the oscillation of the transistor.

FIG. 5 illustrates an alternative embodiment of the dielectric resonator oscillator 100 in which a fourth frequency of operation is obtained. If in oscillator 50 all four of the diodes of the diode switch 60 are reverse biased, then only a stub end is connected to the gate terminal of the transistor 52. In this case, the transistor 52 will weakly oscillate at a frequency related to the length of the stub end. In oscillator 100, a fourth dielectric resonator 102 has been added, and is positioned adjacent to the output microstrip line 66. The fourth dielectric resonator 102 acts as a stabilization resonator, like the dielectric resonator oscillator shown in FIG. 2. The resonant frequency of the dielectric resonator 102 defines the oscillation frequency of the transistor only when all of the diodes of the diode switch 60 are reverse biased, thus yielding a fourth operational frequency. Assuming that the bandwidth of the resonant frequency of the stabilization dielectric resonator 102 does not overlap with the bandwidths of the resonant frequencies of the series feedback dielectric resonators 54, 56, and 58, then resonator 102 will be transparent during operation at the other three operational frequencies.

It is preferable that the highest of the four frequencies be specified by the stabilization dielectric resonator 102 in order to minimize diode resistance losses. Losses, while operating at the frequencies defined by the series feedback dielectric resonators 54, 56, and 58, due to the resistance of the diodes 72, 74, and 76 are proportional to the frequency of operation. There is no diode resistance loss, however, when operating at the frequency defined by the stabilization dielectric resonator 102 because there are no forward biased diodes in that circuit. Therefore, by specifying the stabilization dielectric resonator 102 as the highest frequency resonator, the losses due to diode resistance are minimized.

In FIG. 6, another alternative embodiment of a dielectric resonator oscillator 110 is illustrated. Oscillator 110 has seven available operational frequencies. Three operational frequencies are provided by the series feedback dielectric resonators 54, 56, and 58 that are coupled to the gate terminal of the transistor 52 via the diode switch 60, as described above. A fourth operation frequency is provided by the stabilization dielectric resonator 102, also as described above. Three additional operational frequencies are provided by dielectric resonators 112, 114, and 116, which are coupled to the source of the transistor 52 via another diode switch 118.

The connection of the resonators 112, 114, and 116 to the source terminal of the transistor 52 is similar to the connection of the resonators 54, 56, and 58 to the gate terminal. The source terminal of the transistor 52 is connected to the common anode terminal of the diode switch 118 through a capacitor 120 and to ground through an inductor 119 and a resistor 121 connected in series. The diode switch 118 includes four diodes 122, 124, 126, and 128. The cathodes of diodes 122, 124, and 126 are respectively connected to microstrip lines 130, 132, and 134, which extend past dielectric resonators 112, 114, and 116, respectively. The opposite ends of microstrip lines 130, 132, and 134 are terminated to ground through resistors 136, 138, and 140, respectively. The cathode of diode 128 is terminated to ground through resistor 142. Biasing terminals 144 are provided at the cathode side of each diode for the application of bias voltages to operate the diode switch 118.

The oscillator 110 has seven available operational frequencies. An operational frequency specified by the gate coupled dielectric resonators 54, 56, or 58 is selected by reverse biasing all diodes of diode switch 118, forward biasing the diode of diode switch 60 that connects the selected resonator to the gate terminal, and reverse biasing the remaining diodes of diode switch 60. An operational frequency specified by the source coupled dielectric resonators 112, 114, or 116 is selected by reverse biasing all diodes of diode switch 60, forward biasing the diode of diode switch 118 that connects the selected resonator to the source terminal, and reverse biasing the remaining diodes of diode switch 118. The seventh operational frequency is selected by reverse biasing all of the diodes of both diode switches, in which case the stabilization dielectric resonator 102 determines the oscillation frequency. If no oscillation is desired, then diodes 78 and 128 are forward biased to connect resistors 92 and 142 to the gate and source terminals, respectively, of the transistor 52.

In FIG. 7, another alternative embodiment of a dielectric resonator oscillator 150 is illustrated. In this embodiment, a bipolar transistor 152 is substituted for the field effect transistor 52. The dielectric resonators 54, 56, and 58 are coupled through the diode switch 60 to the base terminal of the transistor 152. The emitter terminal of the transistor 152 is coupled to ground through the capacitor 62, while the collector terminal of the transistor is coupled to the load 68 through the microstrip line 66. The oscillator 150 operates in substantially the same fashion as the oscillator 50. Note that the biasing circuit is not shown in FIG. 7 for simplicity.

In FIG. 8, another alternative embodiment of a resonator oscillator 160 is illustrated. In this embodiment, the resonating elements are the microstrip lines 162, 164, and 166, each of which has a different stub length and, thus, a different resonant frequency. While this embodiment does not offer the stability and accuracy of the other embodiments utilizing dielectric resonators, this is a conceivable way of implementing the present invention.

From the above description, it will be apparent that the invention disclosed herein provides a novel and advantageous apparatus for a switchable multi-frequency dielectric resonator oscillator that generates microwave energy at any of several available frequencies. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A switchable dielectric resonator oscillator for generating microwave energy at a selected one of several available frequencies in the microwave range, said oscillator comprising:
    a transistor operable for oscillation at a frequency in the microwave range as determined by a dielectric resonator and associated microstrip line connected as a series feedback element to the control terminal of said transistor;
    switching means for selectively connecting any one of a plurality of dielectric resonators and associated microstrip lines to the control terminal of said transistor, wherein said switching means includes a plurality of diodes each connected in series between a corresponding dielectric resonator and associated microstrip line and the control terminal of said transistor, and includes diode biasing means for individually biasing said diodes; and
    a plurality of dielectric resonators and associated microstrip lines coupled to said switching means for selective connection to the control terminal of said transistor, wherein the oscillation frequency of said transistor is substantially equal to the resonant frequency of whichever of said dielectric resonators is connected to the control terminal of said transistor through said switching means, and wherein the resonant frequencies of said dielectric resonators are in the microwave range.

2. An oscillator as recited in claim 1 wherein said transistor comprises a field effect transistor, and wherein said switching means is operable for selectively connecting any one of said dielectric resonators to the gate terminal of said field effect transistor.

3. An oscillator as recited in claim 1 wherein said transistor comprises a bipolar junction transistor and wherein said switching means is operable for selectively connecting any one of said dielectric resonators to the base terminal of said bipolar junction transistor.

4. An oscillator as recited in claim 1 wherein said switching means is operable for selectively connecting a dielectric resonator to the control terminal of said transistor by forward biasing the diode that connects said dielectric resonator to said transistor and by reverse biasing the remaining diodes.

5. An oscillator as recited in claim 4 wherein said diodes comprise PIN diodes.

6. An oscillator as recited in claim 4 wherein said switching means further includes a diode connected in series between the control terminal of said transistor and a resistor, that is switched into connection with the control terminal of said transistor to stop the oscillation of said transistor.

7. An oscillator as recited in claim 1 wherein each of said dielectric resonators includes a mass of ceramic material affixed to a substrate at a position adjacent to a microstrip line that is connected to said switching means.

8. An oscillator as recited in claim 7 wherein said mass of ceramic material is formed in the shape of a cylinder, with one base affixed to said substrate.

9. An oscillator as recited in claim 1 further comprising a stabilization resonator coupled to the output terminal of said transistor, and wherein said switching means is operable for isolating said dielectric resonators from the control terminal of said transistor, upon which case the oscillation frequency of said transistor is determined by the resonant frequency of the stabilization resonator coupled to the output terminal of said transistor.

10. An apparatus for generating microwave energy at a selected one of several available frequencies, said apparatus comprising:
    a field effect transistor operable for oscillation at a frequency determined by a feedback resonator connected to either the gate or source terminal of said transistor;
    first switching means for selectively connecting any one of a plurality of first feedback resonators to the gate terminal of said transistor;
    second switching means for selectively connecting any one of a plurality of second feedback resonators to the source terminal of said transistor;
    a plurality of first feedback resonators coupled to said first switching means for selective connection to the gate terminal of said transistor, and
    a plurality of second feedback resonators coupled to said second switching means for selective connection to the source terminal of said transistor, wherein the oscillation frequency of said transistor is determined by the resonant frequency of whichever of said resonators is connected to the gate or source terminal of said transistor through said switching means.

11. An apparatus as recited in claim 10 wherein said first switching means includes a plurality of first diodes each connected in series between a corresponding first feedback resonator and the gate terminal of said transistor, and wherein said first switching means further includes first diode biasing means for individually biasing said first diodes, said first switching means being operable for selectively connecting a first feedback resonator to the gate terminal of said transistor by forward biasing the first diode that connects said first feedback resonator to said transistor and by reverse biasing the remaining first diodes.

12. An apparatus as recited in claim 11 wherein said second switching means includes a plurality of second diodes each connected in series between a corresponding second feedback resonator and the source terminal of said transistor, and wherein said second switching means further includes second diode biasing means for individually biasing said second diodes, said second switching means being operable for selectively connecting a second feedback resonator to the source terminal of said transistor by forward biasing the second diode that connects said second feedback resonator to said transistor and by reverse biasing the remaining second diodes.

13. An apparatus as recited in claim 12 wherein said diodes comprise PIN diodes.

14. An apparatus as recited in claim 12 wherein said first switching means further includes a diode connected in series between the gate terminal of said transistor and a first resistor, wherein said second switching means further includes a diode connected in series between the source terminal of said transistor and a second resistor, and wherein said first switching means is operable for switching said first resistor into connection with the gate terminal of said transistor and said second switching means is operable for switching said second resistor into connection with the source terminal of said transistor in order to stop the oscillation of said transistor.

15. An apparatus as recited in claim 10 wherein said first switching means is operable for isolating said first feedback resonators from the gate terminal of said transistor and said second switching means is operable for isolating said second feedback resonators from the source terminal of said transistor, upon which case the oscillation frequency of said transistor is determined by the resonant frequency of a stabilization resonator coupled to the drain terminal of said transistor.

16. An apparatus as recited in claim 10 wherein said first and second feedback resonators comprise dielectric resonators.

17. A switchable dielectric resonator oscillator for generating microwave energy at a selected one of several available frequencies in the microwave range, said oscillator comprising:
- a field effect transistor operable for oscillation at a frequency in the microwave range as determined by a series feedback signal supplied to the gate terminal of said transistor;
- a plurality of diodes connected in parallel to the gate terminal of said transistor;
- a plurality of dielectric resonators and associated microstrip lines each operatively coupled to the gate terminal of said transistor through one of said diodes and each operable for supplying said series feedback signal, wherein the resonant frequencies of said dielectric resonators are in the microwave range; and
- diode biasing means for individually biasing said diodes, said diode biasing means being operable for selectively connecting a dielectric resonator and associated microstrip line to the gate terminal of said transistor by forward biasing the diode that connects said dielectric resonator and associated microstrip line to said transistor and by reverse biasing the remaining diodes;
- whereby the oscillation frequency of said transistor is substantially equal to the resonant frequency of whichever of said dielectric resonators is connected to the gate terminal of said transistor.

18. An oscillator as recited in claim 17 further comprising a dielectric resonator coupled to the drain terminal of said transistor, and wherein said diode biasing means is operable for isolating said dielectric resonators from the gate terminal of said transistor, upon which case the oscillation frequency of said transistor is determined by the resonant frequency of the dielectric resonator coupled to the drain terminal of said transistor.

19. A switchable dielectric resonator oscillator for generating microwave energy at a selected one of several available frequencies in the microwave range, said oscillator comprising:
- a transistor operable for oscillation at a frequency in the microwave range as determined by a dielectric resonator and associated microstrip line connected as a series feedback element to the control terminal of said transistor;
- a plurality of dielectric resonators and associated microstrip lines selectively coupled through switching means to the control terminal of said transistor, wherein the resonant frequencies of said dielectric resonators are in the microwave range;
- a resistor selectively coupled through said switching means to the control terminal of said transistor; and
- switching means for selectively connecting any one of said dielectric resonators and associated microstrip lines or said resistor to the control terminal of said transistor, wherein said switching means includes a plurality of diodes each connected in series between one of said dielectric resonators and associated microstrip lines or said resistor and the control terminal of said transistor, and includes diode biasing means for individually biasing said diodes, wherein said switching means is operable for selectively connecting a dielectric resonator and associated microstrip line or said resistor to the control terminal of said transistor by forward biasing the diode that connects the dielectric resonator and associated microstrip line or said resistor to said transistor and by reverse biasing the remaining diodes, wherein the oscillation frequency of said transistor is substantially equal to the resonant frequency of whichever of said dielectric resonators is connected to the control terminal of said transistor, and wherein said resistor is operable for stopping the oscillation of said transistor when switched into connection with the control terminal of said transistor.

20. A switchable dielectric resonator oscillator for generating microwave energy at a selected one of several available frequencies in the microwave range, said oscillator comprising:
- a transistor operable for oscillation at a frequency in the microwave range;
- a plurality of dielectric resonators and associated microstrip lines selectively coupled through switching means to the control terminal of said transistor for supplying a series feedback signal thereto, wherein the resonant frequencies of said dielectric resonators are in the microwave range;
- a stabilization resonator coupled to the output terminal of said transistor; and
- switching means for selectively connecting any one of said dielectric resonators and associated microstrip lines to the control terminal of said transistor, in which case the oscillation frequency of said transistor is substantially equal to the resonant frequency of whichever of said dielectric resonators is connected to the control terminal of said transistor, wherein said switching means is also operable for isolating said dielectric resonators from the control terminal of said transistor, in which case the oscillation frequency of said transistor is determined by the resonant frequency of said stabilization resonator.

* * * * *